United States Patent
Lee et al.

(10) Patent No.: US 9,768,163 B2
(45) Date of Patent: Sep. 19, 2017

(54) SEMICONDUCTOR DEVICE AND METHOD FOR FABRICATING THE SAME

(71) Applicants: Doo-Young Lee, Seoul (KR); Sang-Hyun Lee, Seoul (KR); Myung-Hoon Jung, Yongin-si (KR); Do-Hyoung Kim, Hwaseong-si (KR)

(72) Inventors: Doo-Young Lee, Seoul (KR); Sang-Hyun Lee, Seoul (KR); Myung-Hoon Jung, Yongin-si (KR); Do-Hyoung Kim, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 14/744,722

(22) Filed: Jun. 19, 2015

(65) Prior Publication Data
US 2016/0111506 A1  Apr. 21, 2016

(30) Foreign Application Priority Data
Oct. 21, 2014 (KR) .................. 10-2014-0142655

(51) Int. Cl.
*H01L 27/088* (2006.01)
*H01L 29/45* (2006.01)
(Continued)

(52) U.S. Cl.
CPC ...... *H01L 27/088* (2013.01); *H01L 21/28114* (2013.01); *H01L 21/76804* (2013.01); *H01L 21/76843* (2013.01); *H01L 29/41775* (2013.01); *H01L 29/45* (2013.01); *H01L 21/823425* (2013.01); *H01L 21/823475* (2013.01); *H01L 27/0207* (2013.01); *H01L 27/0886* (2013.01); *H01L 27/1104* (2013.01); *H01L 29/41758* (2013.01); *H01L 29/78* (2013.01)

(58) Field of Classification Search
CPC ............. H01L 29/471766; H01L 29/45; H01L 29/41758; H01L 27/088
See application file for complete search history.

(56) References Cited

U.S. PATENT DOCUMENTS 6,673,686 B1  1/2004  Scholz et al.
7,511,349 B2  3/2009  Tsai et al.
(Continued)

FOREIGN PATENT DOCUMENTS

JP  H08236477 A  9/1996
JP  2848260 B2  1/1999
(Continued)

*Primary Examiner* — A. Sefer
(74) *Attorney, Agent, or Firm* — Harness, Dickey & Pierce, P.L.C.

(57) ABSTRACT

A semiconductor device includes a first gate pattern and a second gate pattern on a substrate, the first gate pattern having a first height and the second gate pattern having a second height, an insulating pattern on the substrate covering the first and second gate patterns, the insulating pattern including a trench exposing the substrate between the first and second gate patterns, a spacer contacting at least a portion of a sidewall of the insulating pattern within the trench, the spacer spaced apart from the first and second gate patterns and having a third height larger than the first and second heights, and a contact structure filling the trench.

18 Claims, 20 Drawing Sheets

(51) Int. Cl.
   *H01L 21/768* (2006.01)
   *H01L 21/28* (2006.01)
   *H01L 29/417* (2006.01)
   *H01L 29/78* (2006.01)
   *H01L 21/8234* (2006.01)
   *H01L 27/02* (2006.01)
   *H01L 27/11* (2006.01)

(56) References Cited

U.S. PATENT DOCUMENTS

| | | | |
|---|---|---|---|
| 7,704,878 B2 | 4/2010 | Ngo et al. | |
| 8,409,956 B1* | 4/2013 | Kang | H01L 21/82347 257/E21.578 |
| 2002/0146899 A1* | 10/2002 | Chun | H01L 21/76831 438/618 |
| 2005/0087828 A1* | 4/2005 | Kim | H01L 21/02164 257/429 |
| 2006/0222966 A1* | 10/2006 | Seo | G03F 1/14 430/5 |
| 2007/0023823 A1* | 2/2007 | Lee | H01L 27/115 257/317 |
| 2009/0212370 A1* | 8/2009 | Ikei | H01L 21/76897 257/368 |
| 2009/0280641 A1* | 11/2009 | Kang | H01L 21/28518 438/653 |
| 2011/0062501 A1* | 3/2011 | Soss | H01L 21/28114 257/288 |
| 2011/0281426 A1* | 11/2011 | Kim | H01L 21/76804 438/586 |
| 2011/0291175 A1* | 12/2011 | Jee | H01L 21/28273 257/316 |
| 2012/0156867 A1* | 6/2012 | Jeong | H01L 21/76897 438/586 |
| 2013/0140644 A1* | 6/2013 | Kajimoto | H01L 21/82385 257/392 |
| 2013/0234259 A1* | 9/2013 | Yang | H01L 21/76831 257/401 |
| 2014/0061741 A1 | 3/2014 | Park | |
| 2014/0367761 A1* | 12/2014 | Park | H01L 29/42324 257/316 |
| 2015/0145027 A1* | 5/2015 | Lin | H01L 29/66545 257/330 |
| 2015/0243747 A1* | 8/2015 | Kittl | H01L 27/0886 257/401 |
| 2015/0249036 A1* | 9/2015 | Cai | H01L 27/088 257/382 |
| 2016/0064395 A1* | 3/2016 | Kikuchi | H01L 29/0653 257/315 |
| 2016/0343825 A1* | 11/2016 | Bae | H01L 29/665 |

FOREIGN PATENT DOCUMENTS

| | | |
|---|---|---|
| JP | 2004031638 A | 1/2004 |
| KR | 20000061305 A | 10/2000 |
| KR | 20050024590 A | 3/2005 |
| KR | 20090070534 A | 7/2009 |
| KR | 20120064841 A | 6/2012 |

\* cited by examiner

1200

1300

SEMICONDUCTOR DEVICE AND METHOD FOR FABRICATING THE SAME

CROSS-REFERENCE TO RELATED APPLICATION

This application claims priority from Korean Patent Application No. 10-2014-0142655 filed on Oct. 21, 2014 in the Korean Intellectual Property Office, and all the benefits accruing therefrom under 35 U.S.C. 119, the contents of which in its entirety are herein incorporated by reference.

BACKGROUND

1. Field

Some example embodiments of the present inventive concepts relate to a semiconductor device and a method of fabricating the same.

2. Description of the Related Art

Recently, along with widespread distribution of information media, functions of a semiconductor device are also rapidly developing. In the case of recent semiconductor products, relatively high integration of products is required for better quality and lower costs that are required for competitiveness. Scaling down of semiconductor devices is being performed for relatively high integration.

Studies for increasing the operation speed and integration of a semiconductor device are currently in progress. The semiconductor device includes discrete devices such as an MOS transistor, and as the semiconductor is integrated, the gate of the MOS transistor gradually decreases and the lower channel area of the gate is also getting narrower.

As the gap between the gates of the transistor is reduced, the gap between the gate of the transistor and the contact formed on the source/drain of the transistor is on a rapid decrease.

SUMMARY

Some example embodiments of the present inventive concepts provide a semiconductor device which may prevent or inhibit a short circuit between a gate electrode and a contact by forming a spacer in the contact when forming a contact structure which has enlarged the upper portion of a relatively small contact.

Other example embodiments of the present inventive concepts further provide a method of fabricating a semiconductor device which may prevent or inhibit a short circuit between a gate electrode and a contact by forming a spacer in the contact when forming a contact structure which has enlarged the upper portion of a small contact.

In accordance with an example embodiment of the present inventive concepts, a semiconductor device includes a first gate pattern and a second gate pattern on a substrate, the first gate pattern having a first height and the second gate pattern having a second height, an insulating pattern on the substrate covering the first and second gate patterns, the insulating pattern including a trench exposing the substrate between the first and second gate patterns, a spacer contacting at least a portion of a sidewall of the insulating pattern defining the trench, the spacer spaced apart from the first and second gate patterns and having a third height larger than the first and second heights, and a contact structure filling the trench.

In accordance with another example embodiment of the present inventive concepts, a semiconductor device includes a first gate pattern and a second gate pattern on a substrate, the first gate pattern having a first height and the second gate pattern having a second height, an insulating pattern on the substrate, the insulating pattern covering the first and second gate patterns, an upper contact pattern between the first and second gate patterns, the upper contact pattern having a first width, a lower contact pattern on a lower portion of the upper contact pattern between the first and second gate patterns, the lower contact pattern having a second width narrower than the first width, and a spacer contacting a sidewall of the lower contact pattern, the spacer spaced apart from the first and second gate patterns and having third height larger than the first and second heights.

In accordance with still another example embodiment of the present inventive concepts, a semiconductor device includes a first spacer contacting a sidewall of a gate electrode, the first spacer having a first height, an insulating pattern contacting a sidewall of the first spacer, a second spacer contacting a sidewall of the insulating pattern, the second spacer different from the first spacer and having a second height greater than the first height, the first spacer, the insulating pattern and the second spacer being sequentially arranged, and a conductive layer pattern contacting a sidewall of the second spacer.

In accordance with still another example embodiment of the present inventive concepts, a method of fabricating a semiconductor device includes forming a first insulating pattern covering first and second gate patterns, forming a trench in the first insulating pattern to expose the substrate between the first and second gate patterns, conformally forming a spacer in the trench, forming a second insulating pattern filling the trench, exposing a portion of the spacer by removing a portion of the second insulating layer pattern to leave a remaining second insulating pattern, removing the exposed spacer, removing the remaining second insulating pattern in the trench, and forming a contact structure in the trench.

BRIEF DESCRIPTION OF THE DRAWINGS

The above and other features and advantages of the present inventive concepts will become more apparent by describing in detail example embodiments thereof with reference to the attached drawings in which.

DETAILED DESCRIPTION

Figure 1:
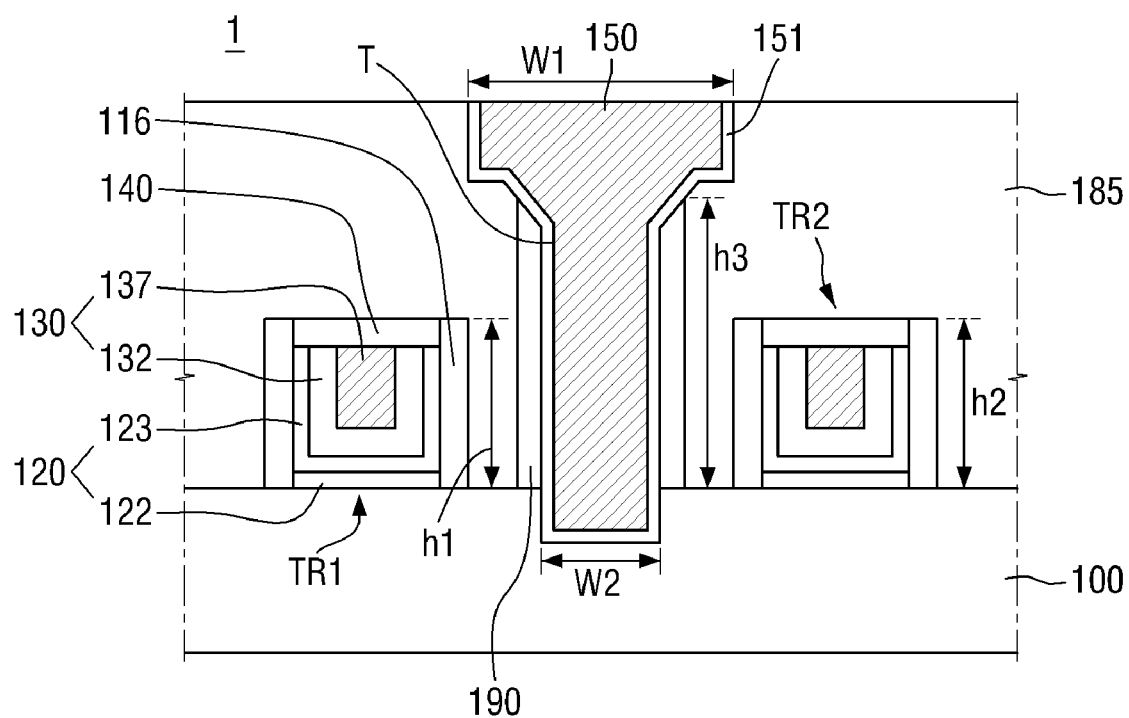
FIG. 1 is a cross-sectional diagram of a semiconductor device according to an example embodiment of the present inventive concepts.

The present inventive concepts will now be described more fully hereinafter with reference to the accompanying drawings, in which example embodiments are shown. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar references in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

The present inventive concepts will be described with reference to perspective views, cross-sectional views, and/or plan views, in which example embodiments are shown. Thus, the profile of an exemplary view may be modified according to manufacturing techniques and/or allowances. That is, the example embodiments are not intended to limit the scope of the present inventive concepts but cover all changes and modifications that can be caused due to a change in manufacturing process. Thus, regions shown in the drawings are illustrated in schematic form and the shapes of the regions are presented simply by way of illustration and not as a limitation.

Hereinafter, a semiconductor device and a method of fabricating the same according to an example embodiment of the present inventive concepts will be described with reference to FIGS. 1 to 10.

FIG. 1 is a cross-sectional diagram of a semiconductor device according to an example embodiment of the present inventive concepts.

Referring to FIG. 1, a semiconductor device according to an example embodiment of the present inventive concepts includes a substrate 100, a first gate pattern TR1, a second gate pattern TR2, an inter-metal dielectric layer 185, a contact metal pattern 150, a contact barrier layer 151, and a first spacer 190.

The substrate 100 may be a hard-type substrate such as a silicon substrate, a silicon on insulator (SOI), a gallium arsenide substrate, a silicon germanium substrate, a ceramic substrate, a quartz substrate, and a glass substrate for a display, or a flexible plastic substrate such as polyimide, polyester, polycarbonate, polyethersulfone, polymethylmethacrylate, polyethylene naphthalate, and polyethyleneterephthalate.

A first gate pattern TR1 and a second gate pattern TR2 may be separately formed on the substrate 100. Here, the first gate pattern TR and the second gate pattern TR2 include substantially the same configuration.

The first gate pattern TR1 may include a first gate spacer 116, a first insulating layer pattern 120, a first gate electrode pattern 130, and a first capping pattern 140.

The first gate spacer 116 may include at least one of a nitride layer, an oxynitride, and a low-k material. The first gate spacer 116 may be formed by using a chemical vapor deposition method, etc. It is illustrated that the first gate spacer 116 is formed as a single layer, but the example embodiment is not limited thereto, and the first gate spacer 116 may be formed as a multi-layer.

Further, it is illustrated that one side of the first gate spacer 116 is of an I shape, but the example embodiment is not limited thereto. For example, the first gate spacer 116 may be of a curved shape or an L shape.

The first insulating layer pattern 120 may include a first interface layer 122 and a first gate insulating layer 123.

The first interface layer 122 may prevent or inhibit a faulty interface between the substrate 100 and the first gate insulating layer 123.

The first interface layer 122 may include a low-k layer, in which a dielectric constant k is 9 or less, such as a silicon oxide layer (k is about 4) or silicon oxynitride (k is between about 4 and about 8 depending on the content of oxygen atoms and nitrogen atoms). Further, the first interface layer 122 may be formed of silicate and may be formed of a combination thereof.

The first interface layer 122 may be formed by using a chemical oxidation method, ultraviolet (UV) oxidation method, a dual plasma oxidation method, etc.

The first gate insulating layer 123 may be formed on the first interface layer 122. However, when the first interface layer 122 does not exist, the first gate insulating layer 123 may be formed on the substrate 100.

The first gate insulating layer 123 may contain materials having a high k. The first gate insulating layer 123 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, Aluminum oxide, lead scandium tantalum oxide, and lead zinc niobate, but the example embodiment is not limited thereto.

Further, the first gate insulating layer 123 may be formed at an appropriate thickness according to the type of a device to be formed. For example, when the first gate insulating layer 123 is $HfO_2$, the first gate insulating layer 123 may be formed at a thickness of about less than 50 Å (between about 5 Å and 50 Å), but the example embodiment is not limited thereto. According to some example embodiments of the present inventive concepts, as illustrated in FIG. 1, the first gate insulating layer 123 may be extended upward along the sidewall of the first gate spacer 116.

The first gate electrode pattern 130 may include a first work function adjustment layer 132 and a first gate metal 137.

The first work function adjustment layer 132 may be formed on the first gate insulating layer 123. The first work function adjustment layer 132 may contact the first gate insulating layer 123 when formed. The first work function adjustment layer 132 is used for work function adjustment.

The first work function adjustment layer 132 may include a metal nitride. The first work function adjustment layer 132 may contain another material according to the type of the semiconductor device 1. For example, a p-type work function adjustment layer may include at least one of TiN, WN, TaN, Ru, and a combination thereof, but the example embodiment is not limited thereto. Further, a n-type work function adjustment layer may include at least one of Ti, Ag, Al, TiAl, TiAlN, TiAlC, TaC, TaCN, TaSiN, Mn, Zr, and a combination thereof, but the example embodiment is not limited thereto.

Further, the p-type work function adjustment layer may be formed of a single layer formed of TiN and a dual layer formed of the lower layer of TiN and the upper layer of TaN, but the example embodiment is not limited thereto.

According to some example embodiments of the present inventive concepts, the first work function adjustment layer 132 may also be extended upward along the sidewall of the first gate spacer 116, as illustrated in FIG. 1.

The first gate metal 137 may be formed on the first work function adjustment layer 132. The first gate metal 137 may contact the first work function adjustment layer 132 when formed. That is, the first gate metal 137 may be formed to fill a space generated by the first work function adjustment layer 132. The first gate metal 137 may contain conductive materials such as W and Al, but the example embodiment is not limited thereto.

The first capping pattern 140 may be formed on the first gate metal 137. The first capping pattern 140 may contact the first gate metal 137 when formed as illustrated. The first capping pattern 140 may contain at least one of SiN, SiON, $SiO_2$, SiCN, SiOCN, and a combination thereof.

The inter-metal dielectric layer 185 may be formed on the substrate 100 and may be formed to cover the first gate pattern TR1 and the second gate pattern TR2. The inter-metal dielectric layer 185 may contain at least one of a low k material, an oxide layer, a nitride layer, and an oxynitride layer. The low k material may include Flowable Oxide (FOX), Tonen SilaZen (TOSZ), Undoped Silica Glass (USG), Borosilica Glass (BSS), PhosphoSilaca Glass (PGS), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OGS), Parylene, bis-benzocyclobutenes (BCB), SiLK, polyimide, porous polymeric material, and a combination thereof, but the example embodiment is not limited thereto.

The contact barrier layer 151 may be formed to cover the sidewall and floor surface of a contact hole which is formed by etching a portion of the inter-metal dielectric layer 185, on the active area of the substrate 100. The contact barrier layer 151 may contain Ti or TiN and may be a stacked layer thereof. The contact barrier layer 151 may be formed by using Atomic Layer Deposition (ADL) or Chemical Vapor Deposition (CVD) process.

The contact metal pattern 150 may be formed on the contact barrier layer 151. The contact metal pattern 150 may contain a metal material. For example, the contact metal pattern 150 may contain tungsten W, aluminum Al, cobalt Co, etc., but the example embodiment is not limited thereto. The contact metal pattern 150 may be a conductive pattern which electrically connects the upper semiconductor pattern with the lower semiconductor pattern.

The first spacer 190 may contact a portion of the sidewall of the trench T which is formed by etching a portion of the inter-metal dielectric layer 185 when formed. The trench T may be formed to expose the substrate 100 between the first gate pattern TR1 and the second gate pattern TR2 within the inter-metal dielectric layer 185. The first spacer 190 may be formed separately from the first gate pattern TR1 and the second gate pattern TR2.

That is, as a portion of the inter-metal dielectric layer 185 between the first gate pattern TR1 and the second gate pattern TR2 is removed, a portion of the inter-metal dielectric layer 185 may remain between the trench T and the first gate pattern TR1 and between the trench T and the second gate pattern TR2. As such, the first spacer 190 formed within the trench T may be formed separately from the first gate pattern TR1 and the second gate pattern TR2.

According to an example embodiment of the present inventive concepts, the height h3 of the first spacer 190 may be higher than the height h1 of the first gate pattern TR1 and the height h2 of the second gate pattern TR2. In the example embodiment of the present inventive concepts, the first spacer 190 prevents or inhibits a short circuit between the first and second gate patterns TR1 and TR2 and the contact metal pattern 150, and thus in order to prevent or inhibit a contact between the contact metal pattern 150 and the first and second gate patterns TR1 and TR2, the height h3 of the first spacer 190 may be formed higher than the heights h1 and h2 of the first and second gate patterns TR1 and TR2.

The upper layer of the first spacer 190 may have a curved shape. After forming the first spacer 190 within the trench T, a dry etching process may be used in the process of removing insulating materials which remain in the trench T. As such, the upper layer of the first spacer 190 comes to have a slanted shape, which will be described later.

Further, the lower surface of the first spacer 190 may contact the substrate 100 when formed. A portion of the inter-metal dielectric layer 185 is removed to expose the substrate 100 between the first gate pattern TR1 and the second gate pattern TR2, and thus the materials of the first spacer 190 may be conformally formed within the trench T so that the lower surface of the first spacer 190 may contact the upper surface of the substrate 100 in the process of forming the first spacer 190. The first spacer 190 is completed by removing a portion of the materials of the first spacer 190 (i.e., the floor surface of the materials of the first spacer 190), and thus the lower surface of the first spacer 190 may contact the upper surface of the substrate 100.

The first spacer 190 may contain a silicon nitride, a silicon oxynitride, a silicon oxide, and a silicon carbon oxynitride (SiOCN). The first spacer 190 may be formed by using a chemical vapor deposition method, etc. Further, the first spacer 190 may be formed of a material other than materials contained in the inter-metal dielectric layer 185.

The contact barrier layer 151 and the contact metal pattern 150 are formed inside the first spacer 190 formed on the sidewall within the trench T, and thus the contact barrier layer 151 and the contact metal pattern 150 may be formed separately from the first gate pattern TR1 and the second gate pattern TR2. Further, the contact barrier layer 151 is deposited on the first spacer 190 and the contact metal pattern 150 is filled, and thus the first spacer 190 may directly contact the contact barrier layer 151 when formed.

In the example embodiment of the present inventive concepts, a contact structure, which has enlarged the upper portion of the small contact, is formed, and thus after the trench T is formed, the material of the first spacer 190 needs to be deposited and the upper portion of the trench T needs to be enlarged. As such, the final contact structure including the contact metal pattern 150 may be of a hammer shape. That is, the contact structure may have a shape in which the width W1 of the upper contact pattern is wider than the width W2 of the lower contact pattern.

In particular, a dry etching process is used in the process of extending the upper portion of the trench T, and thus the directional etching is performed and the upper portion of the trench T may have a rectangular shape.

Hereinafter, a method of fabricating a semiconductor device according to an example embodiment of the present inventive concepts will be described.

Figure 2:
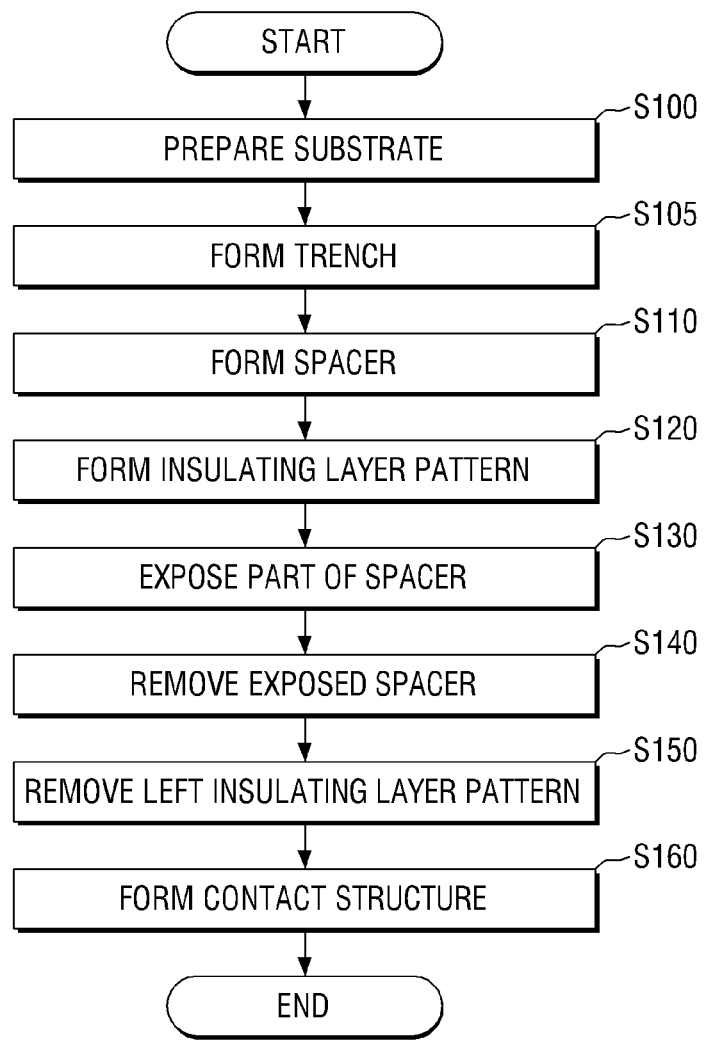
FIG. 2 is a flowchart illustrating a method of fabricating a semiconductor device according to an example embodiment of the present inventive concepts.

FIG. 2 is a flowchart illustrating a method of fabricating a semiconductor device according to an example embodiment of the present inventive concepts. FIGS. 3 to 10 are intermediate views illustrating a method of fabricating a semiconductor device according to an example embodiment of the present inventive concepts.

Figure 3:
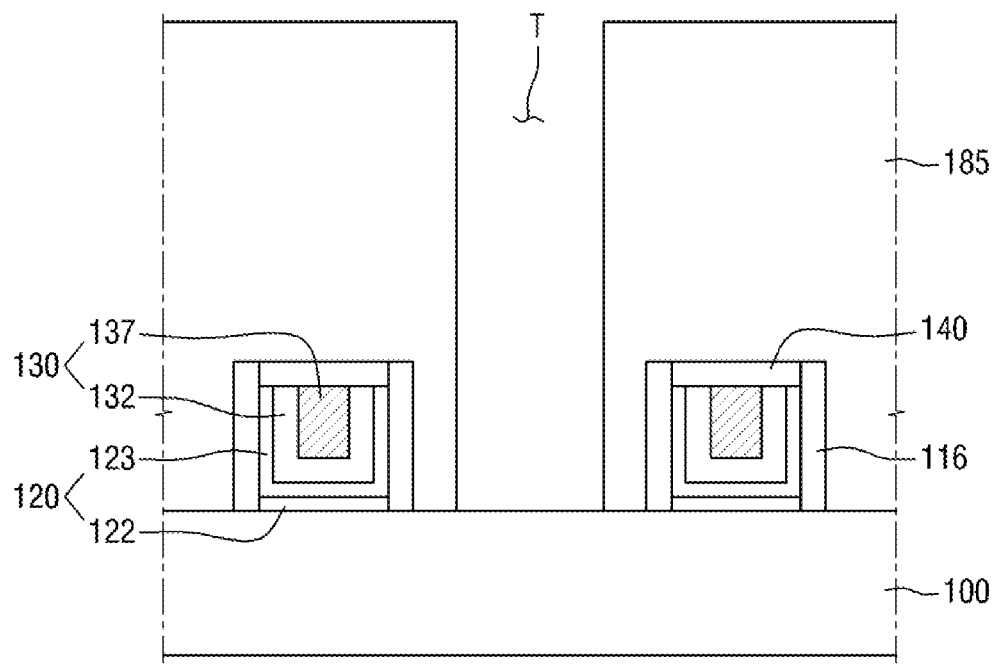
FIGS. 3 to 10 are intermediate views illustrating a method of fabricating a semiconductor device according to an example embodiment of the present inventive concepts.

Referring to FIGS. 2 and 3, a first gate pattern TR1 and a second gate pattern TR2, which are spaced apart from each other, are formed, and a substrate 100, in which an inter-metal dielectric layer 185 to cover the first gate pattern TR1 and the second gate pattern TR2 is formed, is prepared (S100). Further, a trench T is formed within the inter-metal dielectric layer 185 in order to expose the substrate 100 between the first gate pattern TR1 and the second gate pattern TR2 (S105).

Forming of a trench T within the inter-metal dielectric layer 185 may be completed by removing portion of the inter-metal dielectric layer 185 by, for example, a dry etching process, a wet etching process, or a combination thereof.

Figure 4:
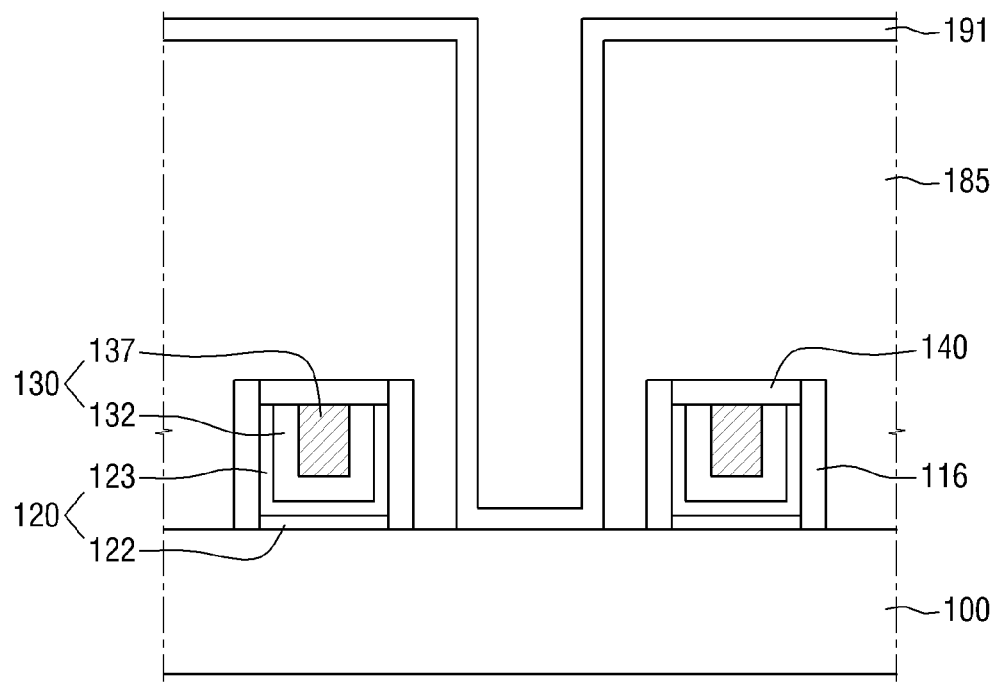

Thereafter, referring to FIGS. 2 and 4, a spacer material 191 is conformally formed within the trench T (S110). A chemical vapor deposition method may be used to form the spacer material 191 within the trench T, but the example embodiment is not limited thereto.

Figure 5:
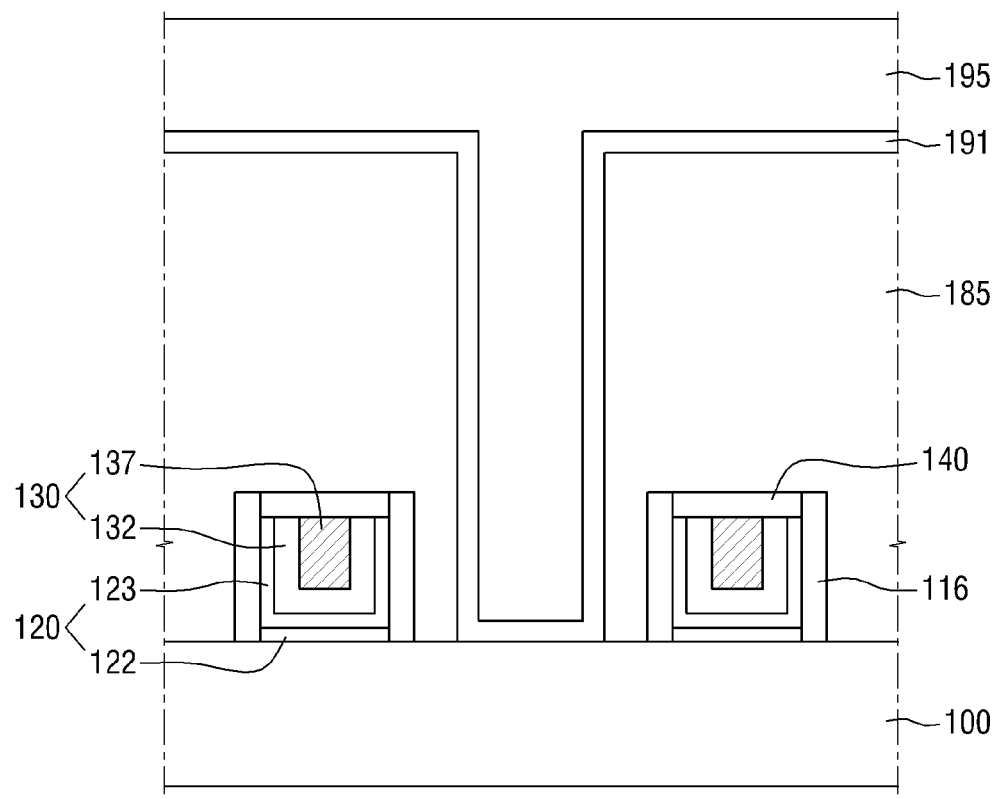

Thereafter, referring to FIGS. 2 and 5, the insulating layer pattern 195 is formed to fill the remaining portion of the trench T (S120). The insulating layer pattern 195 may be formed of a material having an etch selection ratio for the spacer material 191 in order to remove only the insulating layer pattern 195 while retaining a portion of the spacer material 191 in the following process.

Figure 6:
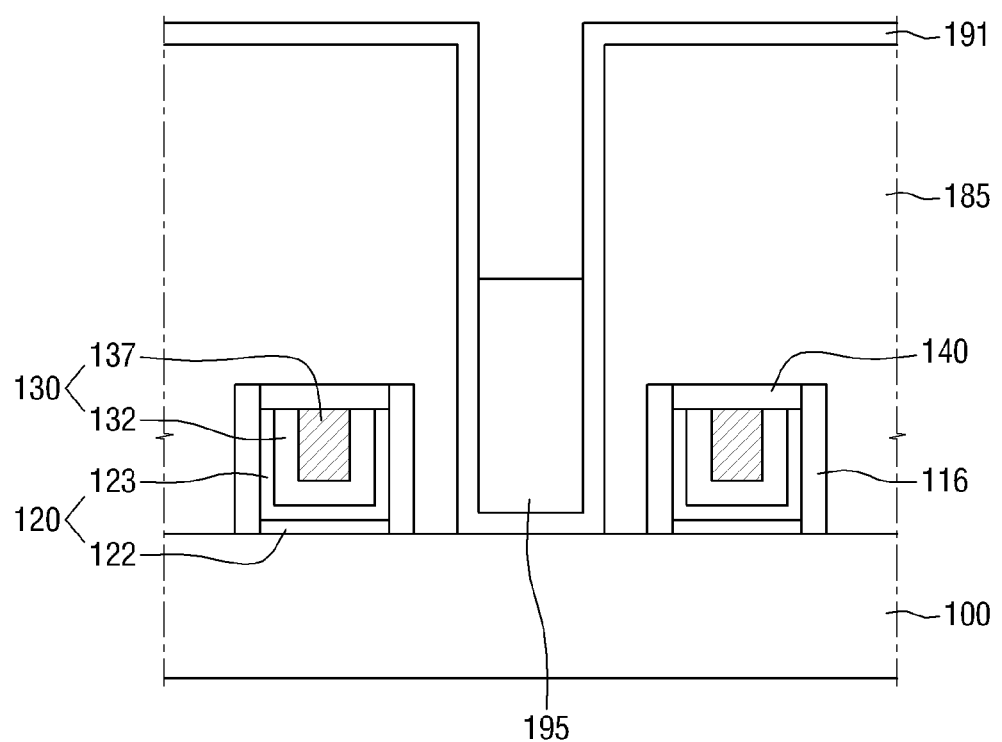

Thereafter, referring to FIGS. 2 and 6, a portion of the spacer material 191 is exposed by exposing a portion of the insulating pattern 195 (S130). At this time, a portion of the insulating layer pattern 195 may be removed through the etchback process. Removing the portion of the insulating layer pattern 195 may be performed in consideration of the height of the first spacer 190 to be formed in the following process. The height of the remaining insulating layer pattern 195 is substantially the same as the height of the first spacer 190 to be formed in the following process.

Figure 7:
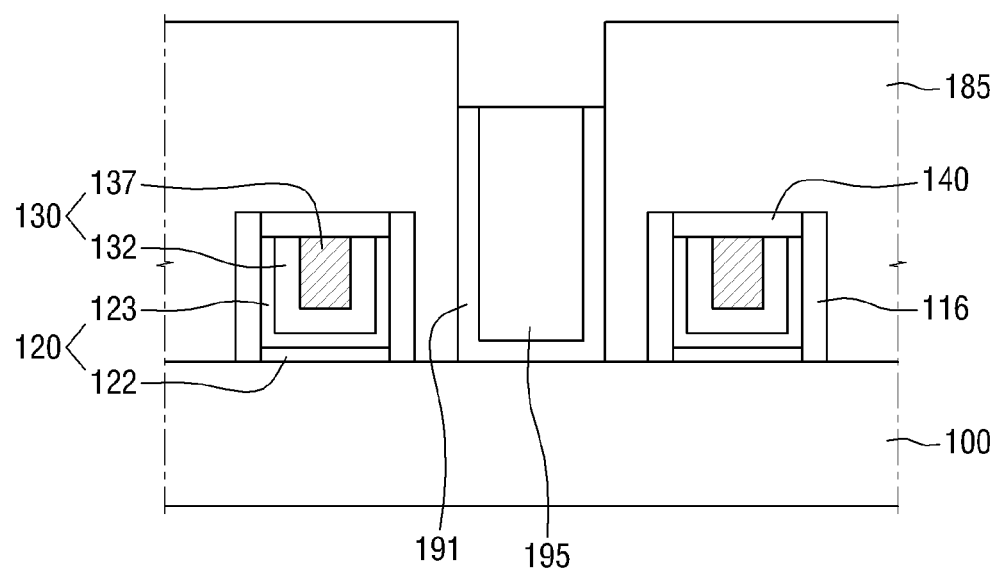

Thereafter, referring to FIGS. 2 and 7, the exposed spacer material 191 is removed (S140). The exposed spacer material 191 may be removed by, for example, a dry etching process, a wet etching process, or a combination thereof. At this time, as a portion of the upper portion of the inter-metal dielectric layer 185 is also removed, the height of the inter-metal dielectric layer 185 is lowered.

Figure 8:
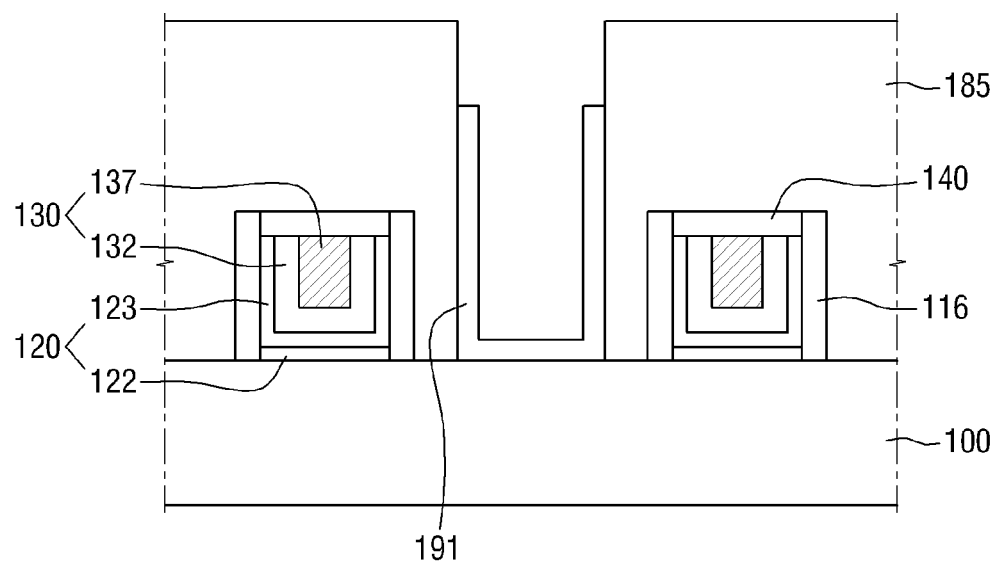

Thereafter, referring to FIGS. 2 and 8, the insulating layer pattern 195, which remain in the trench T, is removed (S150). The insulating layer pattern 195, which remains in the trench T, may be removed by, for example, a dry etching process, a wet etching process, or a combination thereof. The insulating layer pattern 195 is formed of a material having an etch selection ratio for the spacer material 191, and thus the insulating layer pattern 195 may be removed by an isotropic etch process.

Figure 9:
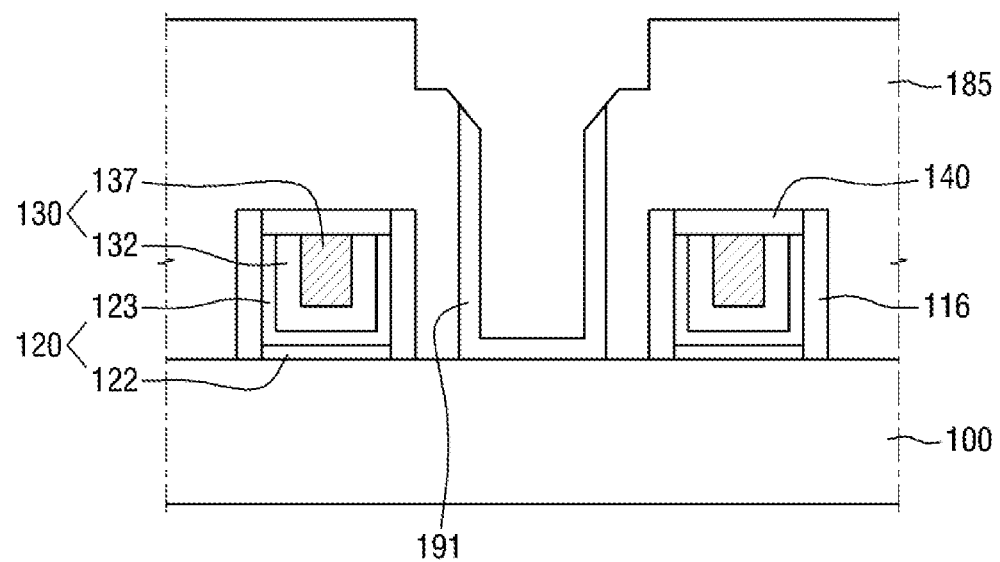

Thereafter, referring to FIG. 9, the upper a portion of the trench T is enlarged in order to secure the contact area, and the shape of the extended trench T may be completed by removing the upper a portion of the trench T by using a dry etch process. The upper surface of the spacer material 191, which remains in the process of extending the upper a portion of the trench T, may have a slanted shape, thereby finally being completed as the first spacer 190.

Figure 10:
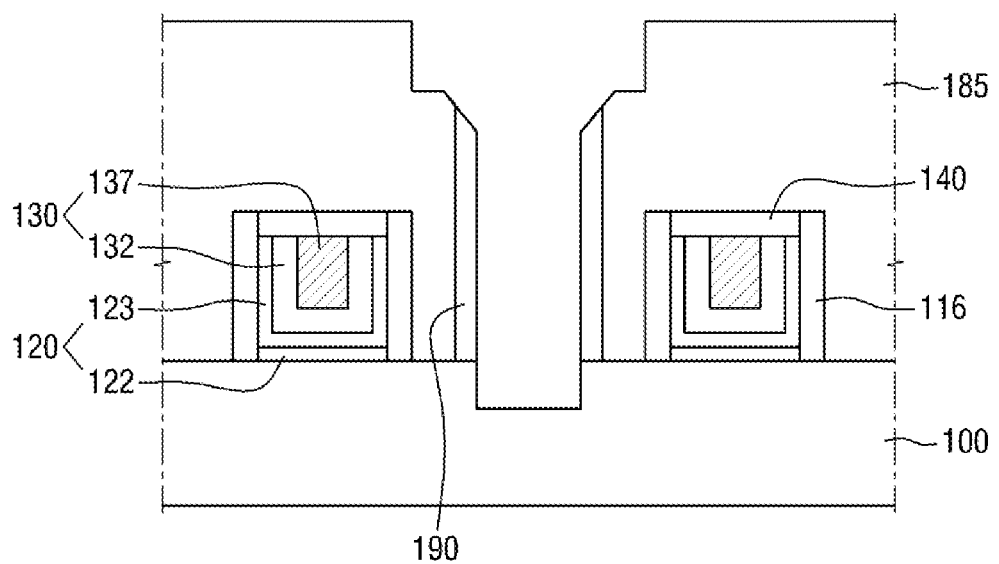

Thereafter, referring to FIG. 10, the first spacer 190 is completed by removing the bottom surface from the remaining spacer material 191. The bottom surface of the remaining spacer material 191 may be removed by a dry etch process. The etch process may be performed by the level lower than the height of the upper surface of the substrate 100 so that the contact may contact the source or drain area in the substrate 100.

Thereafter, referring to FIGS. 1 and 2, a contact structure is completed by forming a contact barrier layer 151 and a contact metal pattern 150 in the trench T (S160).

Hereinafter, a semiconductor device according to other example embodiments of the present inventive concepts will be described.

Figure 11:
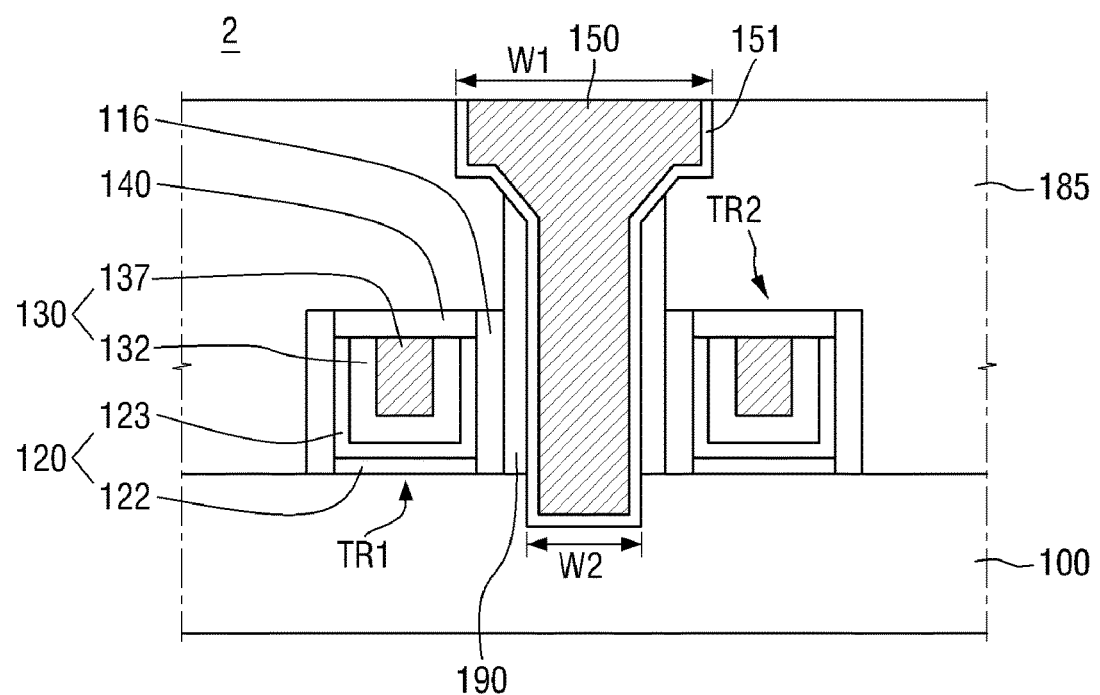
FIG. 11 is a cross-sectional view of a semiconductor device according to another example embodiment of the present inventive concepts.

FIG. 11 is a cross-sectional view of a semiconductor device according to another example embodiment of the present inventive concepts. The points which have already been described with reference to the semiconductor device according to an example embodiment of the present inventive concepts are omitted here for the convenience of description.

Referring to FIG. 11, the semiconductor device 2 according to another example embodiment of the present inventive concepts includes a substrate 100, a first gate pattern TR1, a second gate pattern TR2, an inter-metal dielectric layer 185, a contact metal pattern 150, a contact barrier layer 151, and a first spacer 190.

Here, the detailed description of the substrate 100, the first gate pattern TR1, the second gate pattern TR2, the inter-metal dielectric layer 185, the contact metal pattern 150, the contact barrier layer 151, and the first spacer 190 is substantially the same as the points described above.

However, the semiconductor device 2 may be formed by the contact of the first gate spacer 116 and the first spacer 190. In an area where the pitch between the first gate pattern TR1 and the second gate pattern TR2 is narrow, a trench T may be formed in the inter-metal dielectric layer 185 so that the trench T may contact the first gate spacer 116. The first spacer 190 is formed to contact the sidewall within the trench T, and thus in the final structure, the first gate spacer 116 and the first spacer 190 may contact when formed.

In particular, in an area where the pitch between the first gate pattern TR1 and the second gate pattern TR2 is narrow, there is a high possibility that a short circuit is generated between the contact metal pattern 150 and the first gate pattern TR1 or the second gate pattern TR2, and thus using the method of fabricating the semiconductor device according to example embodiments of the present inventive concepts may be efficient.

Figure 12:
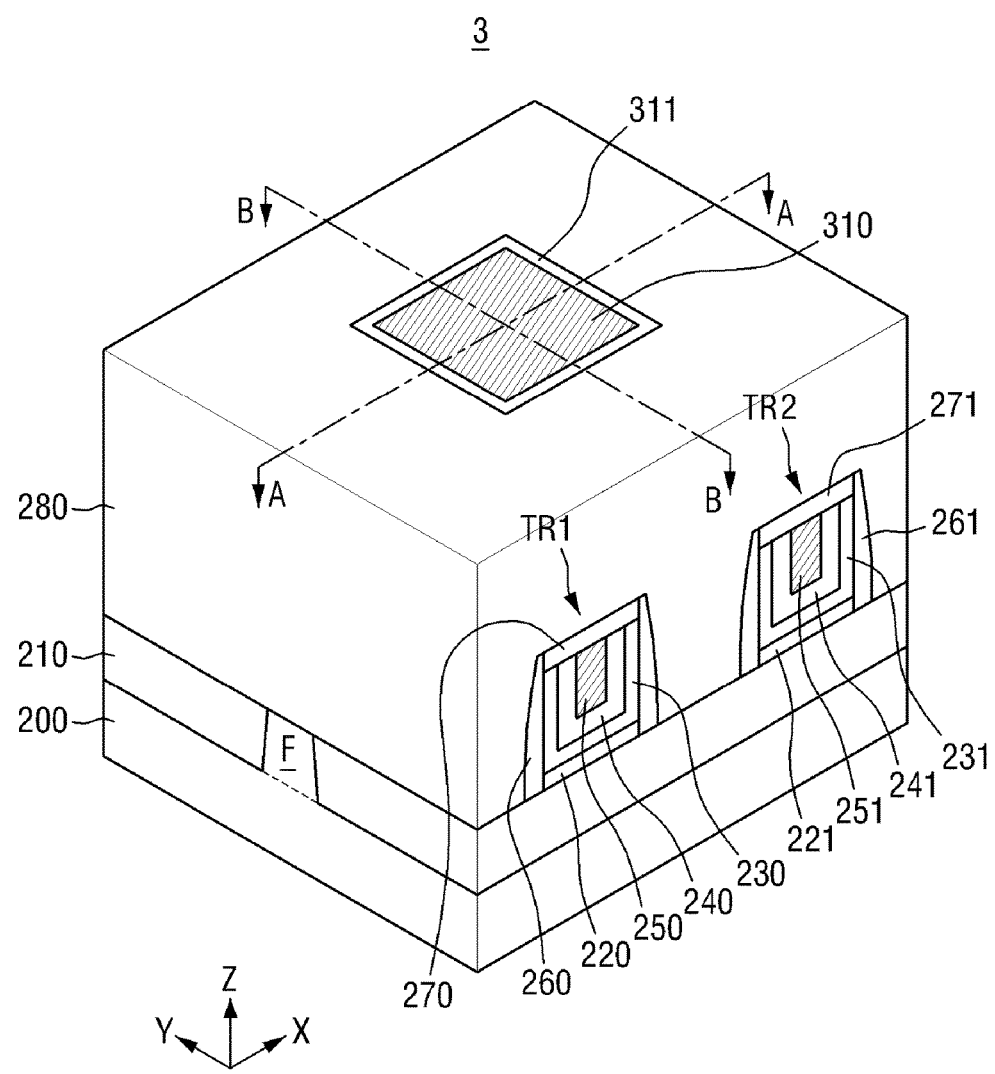
FIG. 12 is a perspective view of a semiconductor device according to another example embodiment of the present inventive concepts.
Figure 13:
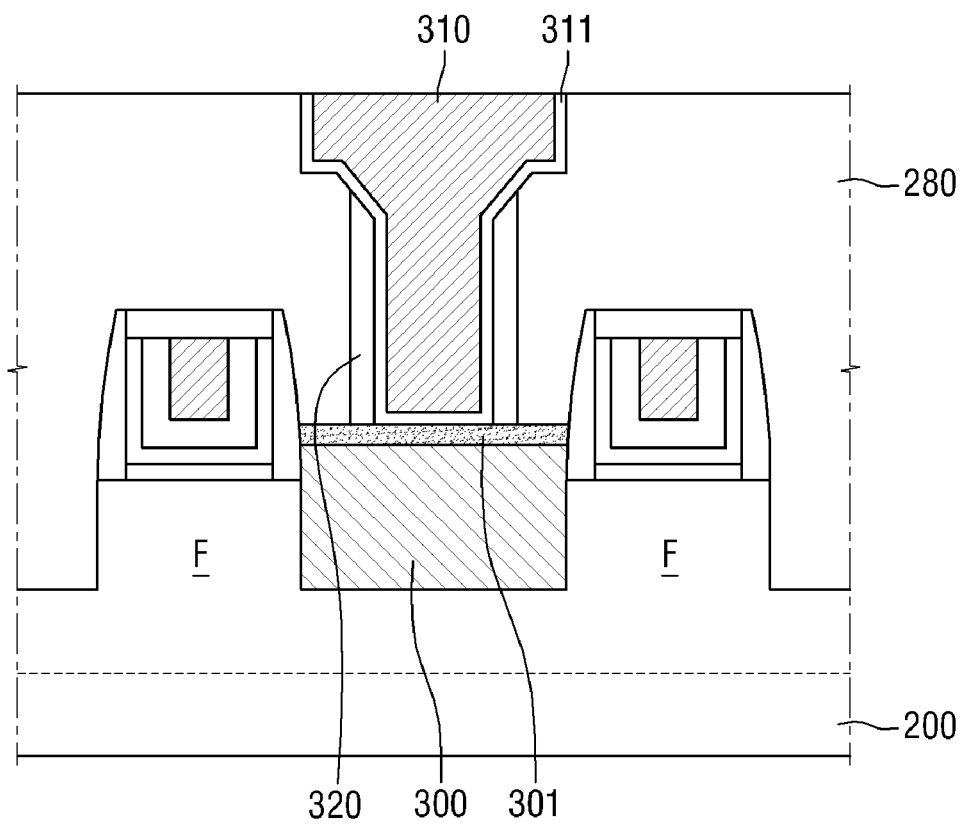
FIG. 13 is a cross-sectional view cut along the A-A line of FIG. 12.
Figure 14:
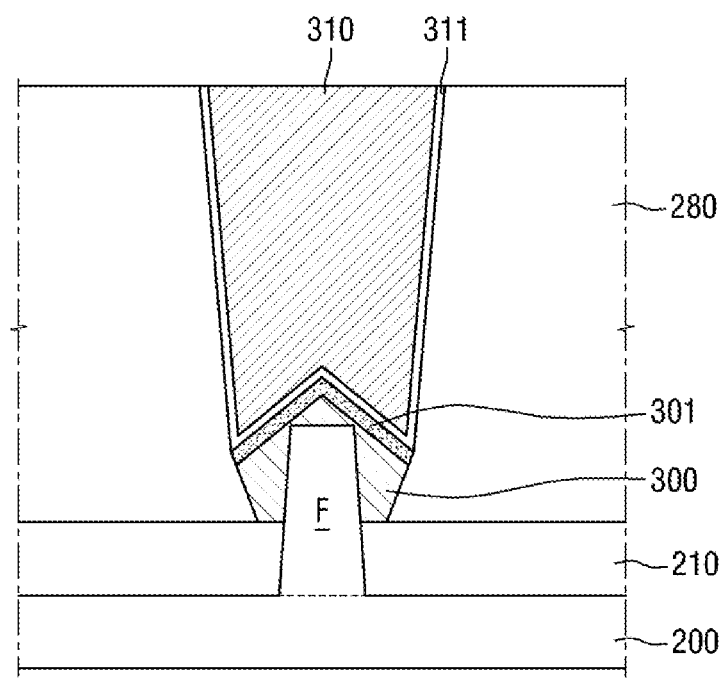
FIG. 14 is a cross-sectional view cut along the B-B line of FIG. 12.

FIG. 12 is a perspective view of a semiconductor device according to another example embodiment of the present inventive concepts. FIG. 13 is a cross-sectional view cut along the A-A line of FIG. 12. FIG. 14 is a cross-sectional view cut along the B-B line of FIG. 12. The points which have already been described with reference to the semiconductor device according to an example embodiment of the present inventive concepts are omitted here for the convenience of description.

Referring to FIGS. 12 to 14, a semiconductor device 3 according to another example embodiment of the present inventive concepts is a pin-type semiconductor device.

That is, in the semiconductor device 3, a substrate 200 may include a pin-type active pattern. When the substrate 200 includes a pin-type active pattern, the pin-type active pattern may include silicon or germanium which is element semiconductor materials. Further, the pin-type active pattern may include a compound semiconductor such as a Group IV-IV compound semiconductor or Group III-V compound semiconductor.

The Group IV-IV compound semiconductor may be a binary compound containing at least two of carbon C, silicon Si, germanium Ge, and tin Sn, a ternary compound, or a compound which an IV element has been doped thereto.

The Group III-V compound semiconductor a binary compound, a ternary compound, or a quaternary compound which is formed by combination of at least one of aluminum (Al), gallium (Ga), and indium (In), and one of phosphorus (P), arsenic (As), and antimony (Sb).

Specifically, the semiconductor device 3 includes a substrate 200, a field insulating layer 210, a fin F, a first gate pattern TR1, a second gate pattern TR2, an inter-metal dielectric layer 280, a source or drain 300, a silicide 301, a contact metal pattern 310, a contact barrier layer 311, and a second spacer 320.

The substrate 200 may be a hard-type substrate such as a silicon substrate, a silicon on insulator (SOI), a gallium arsenide substrate, a silicon germanium substrate, a ceramic substrate, a quartz substrate, and a glass substrate for a display, or a flexible plastic substrate such as polyimide, polyester, polycarbonate, polyethersulfone, polymethylmethacrylate, polyethylene naphthalate, and polyethyleneterephthalate.

The field insulating layer 210 is formed on the substrate 200 and is used for device separation. The field insulating layer 210 may be a HDP oxide layer, a SOG oxide layer, or a CVD oxide layer, but the example embodiment is not limited thereto.

The fin F is formed on the substrate 200. In particular, the fin F may be projected on the substrate 200 when formed. In particular, the fin F may be projected from the substrate 100 in a third direction Z when formed. The fin F may be a portion of the substrate 200 and may contain an epitaxial layer which has grown from the substrate 200. The fin F may be extended in the first direction X. The field insulating layer 210 may cover a portion of the upper surface of the substrate 100 and the side surface of the fin F.

The first gate pattern TR1 may be formed on the fin F in a direction that crosses the fin F. That is, the first gate pattern TR1 may be extended in the second direction Y.

The first gate pattern TR1 may include a second interface layer 220, a second gate insulating layer 230, a second work function adjustment layer 240, a second gate metal 250, a second gate spacer 260, and a second capping pattern 270 which are sequentially formed on the fin F. A channel may be formed on both the side surface and the upper surface of the fin F due to such a structure.

The second interface layer 220 may be formed on the field insulating layer 210 and the fin F. The second interface layer 220 may prevent or inhibit a faulty interface between the first insulating layer 210 and the second gate insulating layer 230.

The second interface layer 220 may include a low-k material layer, whose dielectric constant k is 9 or less, such as a silicon oxide layer (k is about 4) or a silicon oxynitride (k is between about 4 and about 8 depending on the content of oxygen atoms and nitrogen atoms). Further, the second interface layer 220 may be formed of a silicate and may be formed of a combination of layers which have been illustrated above.

The second gate insulating layer 230 may be formed on the second interface layer 220. However, when the second interface layer 220 does not exist, the second gate insulating layer 230 may be formed on both the field insulating layer 210 and the fin F.

The second gate insulating layer 230 may include a material whose dielectric constant k is high. Specifically, the second gate insulating layer 230 may contain one of selected from a group composed of HfSiON, HfO2, ZrO2, Ta2O5, TiO2, SrTiO3, BaTiO3, and SrTiO3.

Further, the second gate insulating layer 230 may be formed with an appropriate thickness according to the type of a device to be formed. For example, when the second gate insulating layer 230 is HfO2, the second gate insulating layer 230 may be formed with a thickness of about less than 50 Å (between about 5 Å and about 50 Å), but the example embodiment is not limited thereto. The second gate insulating layer 230 may be extended upward along the sidewall of the second gate spacer 260 to be described later.

The second work function adjustment layer 240 may be formed on the second gate insulating layer 230. The second work function adjustment layer 230 may contact the second gate insulating layer 230 when formed. The second work function adjustment layer 240 is used for work function adjustment.

The second work function adjustment layer 240 may contain a metal nitride. Specifically, the second work function adjustment layer 240 may contain at least one of Mo, Pd, Ru, Pt, TiN, WN, TaN, Ir, TaC, RuN, TiAl, TaAlC, TiAlN, and MoN. More specifically, the second work function adjustment layer 240 may be formed of a single layer formed of TiN or a dual layer formed of the lower layer of TiN and the upper layer of TaN, but the example embodiment is not limited thereto.

The second work function adjustment layer 240 may be extended upward along the sidewall of the second gate spacer 260 to be described later.

The gate metal 250 may be formed on the second work function adjustment layer 240. As illustrated, the second gate metal 250 may contact the second work function adjustment layer 240 when formed. That is, the second gate metal 250 may be formed to fill a space generated by the second work function adjustment layer 240. The second gate metal 250 may contain a conductive material such as W or Al, but the example embodiment is not limited thereto.

The second gate spacer 260 may be formed on at least one of side surfaces of the first gate pattern TR1. The second gate spacer 260 may include at least one of a nitride layer, an oxynitride layer, and a low-k material.

Further, it was illustrated in the drawings that one side surface the second gate spacer 260 has an I shape, but the example embodiment is not limited thereto. The shape of the second gate spacer 260 may be different. For example, the second gate spacer 260 may be formed of a curved shape or an L shape.

Further, it was illustrated in the drawings that the second gate spacer 260 is formed as a single layer, but the example embodiment is not limited thereto. The second gate spacer 260 may be formed of a plurality of layers.

The second capping pattern 270 may be formed on the second gate metal 250. The second capping pattern 270 may contact the second gate metal 250 when formed, as illustrated. That is, the second capping pattern 270 may be formed to fill a space formed on the second gate metal 250 within the first gate pattern TR1. The second capping pattern 270 may contain a silicon nitride SiN, but the example embodiment is not limited thereto.

The second gate pattern TR2 may be formed in a direction that crosses the fin F. The second gate pattern TR2 may be extended in the second direction Y.

The second gate pattern TR2 may include substantially the same configuration as that of the above-described first gate pattern TR1. That is, the second gate pattern TR2 may include a third interface layer 221, a third gate insulating layer 231, a third work function adjustment layer 241, a third gate metal 251, a third gate spacer 261, and a third capping pattern 271.

The third interface layer 221, the third gate insulating layer 231, the third work function adjustment layer 241, the third gate metal 251, the third gate spacer 261, and the third capping pattern 271 are substantially the same as the second interface layer 220, the second gate insulating layer 230, the second work function adjustment layer 240, the second gate metal 250, the second gate spacer 260, and the second capping pattern 270.

The inter-metal dielectric layer 280 may be formed on the substrate 200 and may be formed to cover the first gate pattern TR1 and the second gate pattern TR2. The inter-metal dielectric layer 280 may include at least one of a low-k material, an oxide layer, a nitride layer, and an oxynitride layer. The low-k material may include Flowable Oxide (FOX), Tonen SilaZen (TOSZ), Undoped Silica Glass (USG), Borosilica Glass (BSS), PhosphoSilaca Glass (PGS), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OGS), Parylene, bis-benzocyclobutenes (BCB), SiLK, polyimide, porous polymeric material, and a combination thereof, but the example embodiment is not limited thereto.

Further, the source or drain 300 may be formed between the first gate pattern TR1 and the second gate pattern TR2 and may be formed within the fin F. The source or drain 300 and the first and second gate patterns TR1 and TR2 may be insulated respectively by the second gate spacer 260 and the third gate spacer 261.

When the semiconductor device 3 is an NMOS transistor, the source or drain 300 may contain the same material as that of the substrate or tensile stress material. For example, when the substrate 200 is Si, the source or drain 300 may include Si or a material whose lattice constant is small (e.g., SiC or SiP). The tensile stress material may improve mobility of the carrier of a channel area by applying tensile stress to the channel area.

Further, when the semiconductor device 3 is PMOS transistor, the source or drain 300 may include a compressive stress material. For example, the compressive stress material may be a material, whose lattice constant is large compared to Si, such as SiGe. The mobility of the carrier of the channel area may be improved by applying compressive stress to the channel area.

In some example embodiments of the present inventive concepts, such a source or drain 300 may be formed through epitaxial growth, but the example embodiment is not limited thereto.

The silicide 301 may be formed on the source or drain 300. The silicide 301 may include at least one of NiPtSi, NiSi, CoSi, and TiSi, but the example embodiment is not limited thereto. The silicide 301 and the first and second gate patterns TR1 and TR2 may be respectively insulated by the second gate spacer 260 and the third gate spacer 261.

The silicide 301 may be formed on the externally exposed source or drain 300 by using a silicate process before the contact metal pattern 310 and the contact barrier layer 311 to be described later are formed.

The contact barrier layer 311 may be formed to cover the sidewall and the bottom surface of the contact hole formed on the source or drain 300. The contact barrier layer 311 may contain Ti or TiN or may be a stacked layer thereof.

The contact barrier layer 311 may be formed by suing an atomic layer deposition (ALD) or chemical vapor deposition (CVD) process.

The contact metal pattern 310 may be formed on the contact barrier layer 311. The contact metal pattern 310 may contain a metal material. For example, the contact metal pattern 310 may contain tungsten W, aluminum Al, and cobalt Co, but the example embodiment is not limited thereto. The contact metal pattern 310 may be a conductive pattern which electrically connects the upper semiconductor pattern with the lower semiconductor pattern.

The second spacer 320 may contact a portion of the sidewall of the trench T which is formed by etching a portion of the inter-metal dielectric layer 280 when formed. The trench T may be formed to expose the silicide 301 between the first gate pattern TR1 and the second gate pattern TR2 within the inter-metal dielectric layer 280. The second spacer 320 may be formed as the first gate pattern TR1 and the second gate pattern TR2 are spaced apart from each other.

Figure 15:
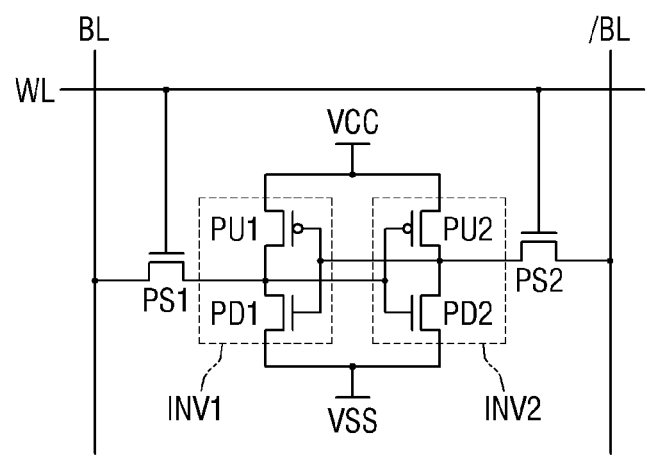
FIGS. 15 to 17 are a circuit diagram and layout diagram of a semiconductor device according to another example embodiment of the present inventive concepts.
Figure 16:
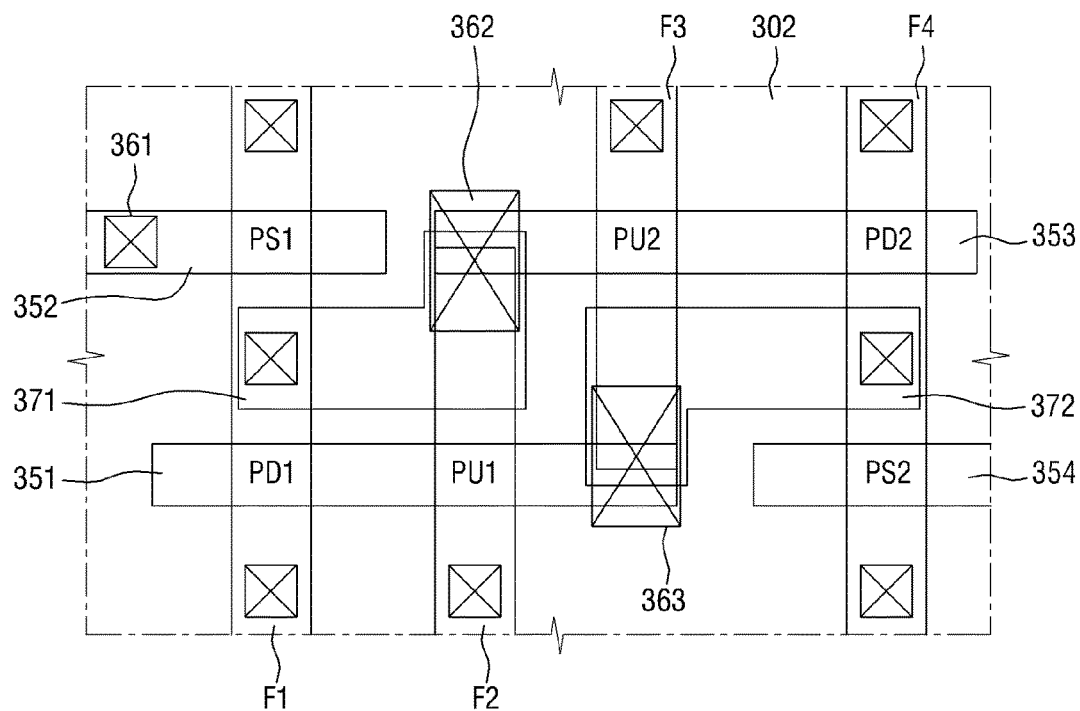
Figure 17:
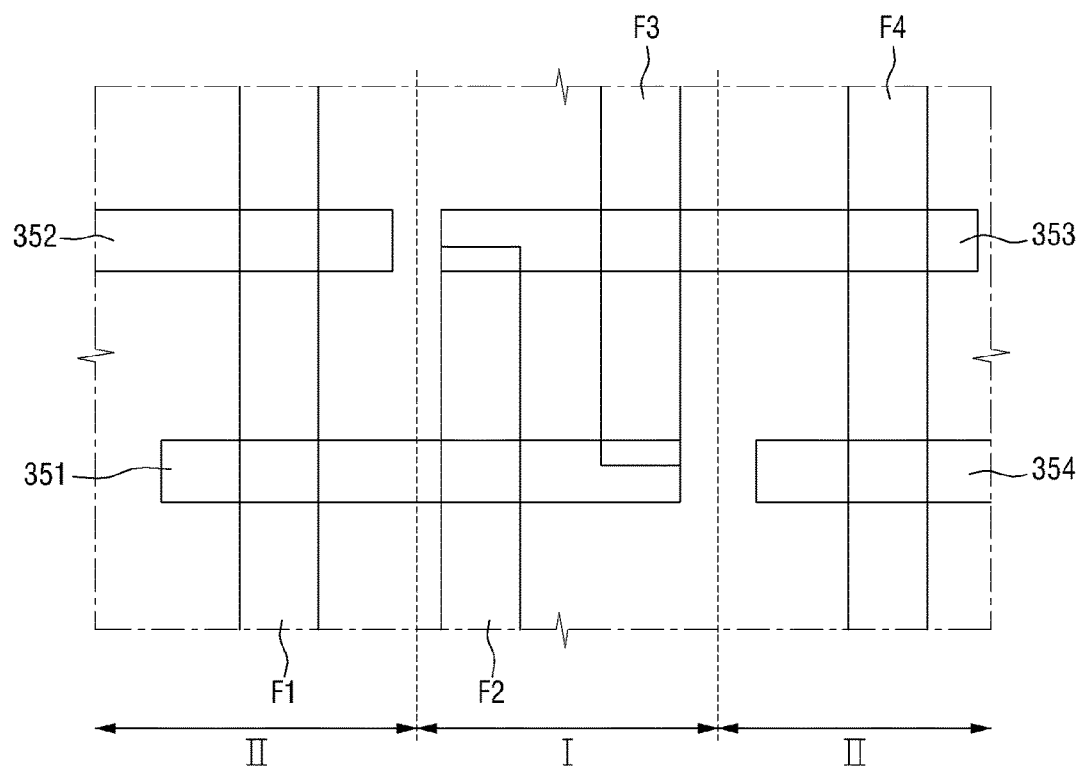

FIGS. 15 to 17 are a circuit diagram and layout diagram of a semiconductor device according to another example embodiment of the present inventive concepts.

FIGS. 15 to 16 are a circuit diagram and layout diagram of a semiconductor device according to another example embodiment of the present inventive concepts. FIG. 17 illustrates only a plurality of pins and a plurality of gate structures in the layout of FIG. 16. The semiconductor device according to some above-described embodiments of the present inventive concepts may be applied to all devices composed of general logic devices, but FIGS. 15 to 17 illustrate SRAM as an example.

First, referring to FIG. 15, the semiconductor device according to another example embodiment of the present inventive concepts may include a pair of inverters INV1 and INV2 which are connected in parallel between a power node Vcc and a ground node Vss, and a first pass transistor PS1 and a second pass transistor PS2 which are connected to the output node of each of the inverters INV1 and INV2.

The first pass transistor PS1 and the second pass transistor PS2 may be connected to the bit line BL and the complementary bit line (/BL). The gate of the first pass transistor PS1 and the second pass transistor PS2 may be connected to the word line WL.

The first inverter INV1 includes a first pull-up transistor PU1 and a first pull-down transistor PD1 which are connected in series, and the second inverter INV2 includes a second pull-up transistor PU2 and a second pull-down transistor PD2 which are connected in series.

The first pull-up transistor PU1 and the second pull-up transistor PU2 may be a PMOS transistor, and the first pull-down transistor PD1 and the second pull-down transistor PD2 may be an NMOS transistor.

Further, in the first inverter INV1 and the second inverter INV2, the input node of the first inverter INV1 may be connected to the output node of the second inverter INV2 and the input node of the second inverter INV2 may be connected to the output node of the first inverter INV1 in order to form one latch circuit.

Here, referring to FIGS. 15 to 17, a first fin F1, a second fin F2, a third fin F3, and a fourth fin F4, which are spaced apart from each other, are extended in one direction (e.g., a vertical direction of FIG. 16) when formed. The extended length of the second fin F2 and the third fin F3 may be shorter than that of the first fin F1 and the fourth fin F4.

Further, the first gate structure 351, the second gate structure 352, the third gate structure 353, and the fourth gate structure 354 are extended in another direction (e.g., a horizontal direction of FIG. 16) and are formed in a direction that crosses the first fin F1 and the fourth fin F4.

Specifically, the first gate structure 351 may be formed to completely cross the first fin F1 and the second fin F2 and overlap with a portion of the end of the third fin F3. The third gate structure 353 may be formed to completely cross the fourth fin F4 and the third fin F3 and partly overlap with the end of the second fin F2. The second gate structure 352 and the fourth gate structure 354 may be formed to respectively cross the first fin F1 and the fourth fin F4.

As illustrated in FIG. 16, the first pull-up transistor PU1 is defined in an area around the area where the first gate structure 351 and the second fin F2 cross, the first pull-down transistor PD1 is defined in an area around the area where the first gate structure 351 and the first fin F1 cross, and the first pass transistor PS1 is defined in an area around the area where the second gate structure 352 and the first fin F1 cross.

The second pull-transistor PU2 is defined in an area around the area where the third gate structure 353 and the third fin F3 cross, the second pull-down transistor PD2 is defined in an area where the third gate structure 353 and the fourth fin F4 cross, and the second pass transistor PS2 is defined in an area where the fourth gate structure 354 and the fourth fin F4 cross.

Though not clearly illustrated, a recess may be formed in both sides of the area where the first to fourth gate structures 351 to 354 and the first to fourth fins F1 to F4 cross, a source or drain may be formed within the recess, and a plurality of contacts 361 may be formed.

Further, a shared contact 362 simultaneously connects the second fin, the third gate structure 353, and wiring 371. A shared contact 363 simultaneously connects a third fin F3, a first gate structure 351, and wiring 372.

The semiconductor device according to some example embodiments of the present inventive concepts may be adopted to the first pull-up transistor PU1, the first pull-down transistor PD1, the first pass transistor PS1, the second pull-up transistor PU2, the second pull-down transistor PD2, and the second pass transistor PS2.

Figure 18:
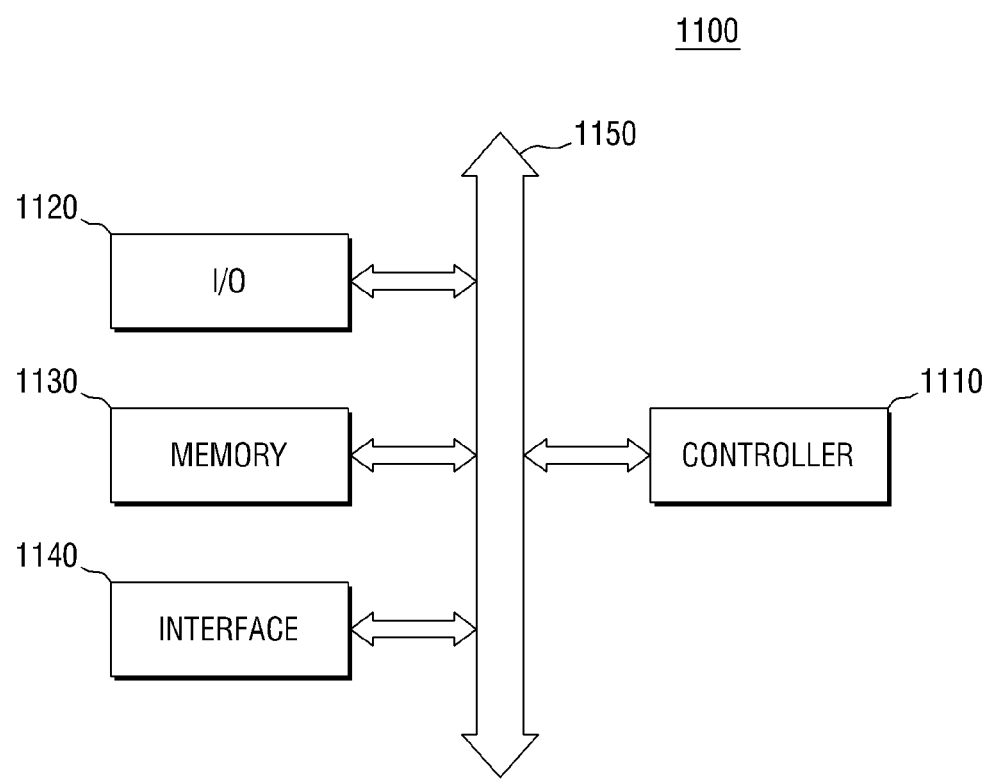
FIG. 18 is a block diagram of an electronic system including a semiconductor device according to some example embodiments of the present inventive concepts.

FIG. 18 is a block diagram of an electronic system including a semiconductor device according to some example embodiments of the present inventive concepts.

Referring to FIG. 18, an electronic system 1100 according to an example embodiment of the present inventive concepts includes a controller 1110, an input/output device (I/O) 1120, a memory device 1130, an interface 1140, and a bus 1150. The controller 1110, the input/output device 1120, the memory device 1130, and/or the interface 1150 may be connected via the bus 1150. The bus corresponds to a path through which data is transferred.

The controller 1110 may include at least one of a microprocessor, a digital signal processor, a microcontroller, and logical devices capable of performing functions similar to the functions of the microprocessor, the digital signal process, and the microcontroller. The input/output device 1120 may include a keypad, a keyboard, and a display device. The memory device 1130 may store data and/or commands. The interface 1140 may perform a function which transmits data to a communication network or receives data from the communication network. The interface 1140 may be of a wired or wireless type. For example, the interface 1140 may include an antenna or a wired or wireless transceiver. Though not illustrated, the electronic system 1100 may further include a high-speed DRAM and/or SRAM as an operation memory for improving operation of the controller 1110. The semiconductor device according some example embodiments of the present inventive concepts may be provided within a memory device 1130 or may be provided as a portion of the controller 1110 and the input/output device (I/O) 1120.

The electronic system 1100 may be applied to a personal digital assistant (PDA), a portable computer, a web tablet, a wireless phone, a mobile phone, a digital music player, a memory card, or all electronic devices which may transmit and/or receive information in a wireless environment.

Figure 19:
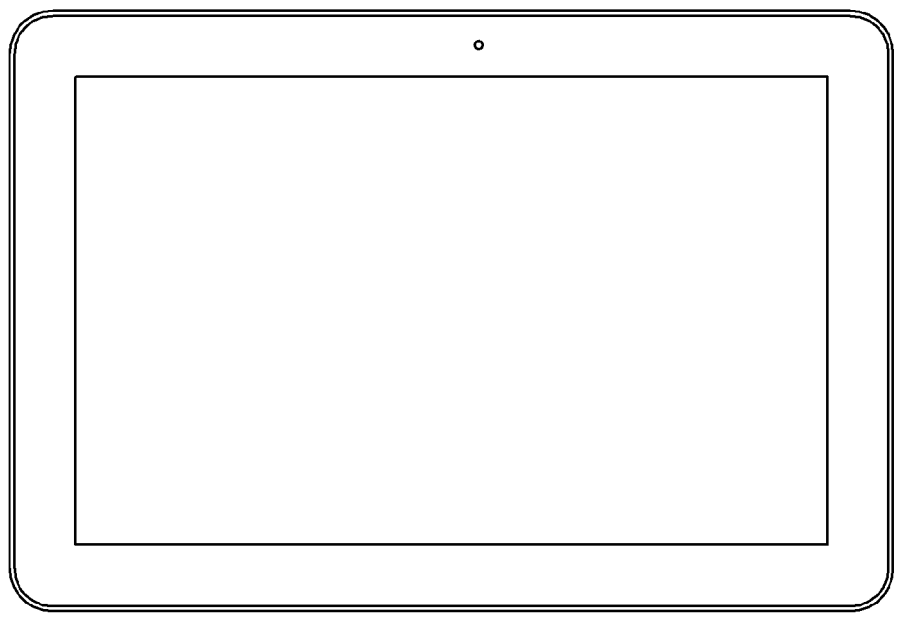
FIGS. 19 and 20 are a semiconductor system which may apply a semiconductor device according to some example embodiments of the present inventive concepts.
Figure 20:
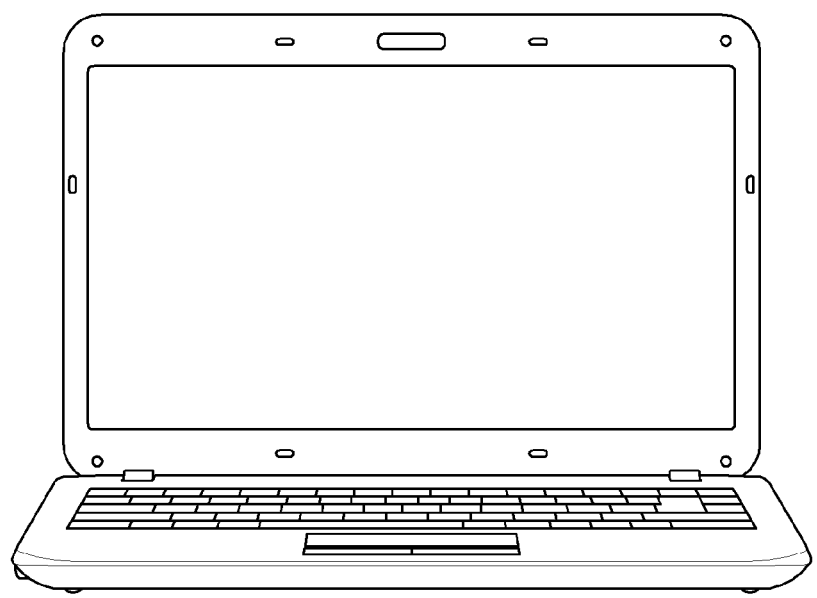

FIGS. 19 and 20 are a semiconductor system which may apply a semiconductor device according to some example embodiments of the present inventive concepts. FIG. 19 illustrates a table PC and FIG. 20 illustrates a notebook computer. At least one of the semiconductor devices according to some example embodiments of the present inventive concepts may be used in a tablet PC, a notebook computer, etc. It is obvious to one of ordinary skill in the art that the semiconductor device according to some example embodiments of the present inventive concepts may also be applied to other integrated circuit devices which have not been illustrated.

The example embodiments of the present inventive concepts have been described with reference to the attached drawings, but it may be understood by one of ordinary skill in the art that the present inventive concepts may be performed one of ordinary skill in the art in other specific forms without changing the technical concepts or essential features of the present inventive concepts. Further, the above-described example embodiments are merely examples and do not limit the scope of the present inventive concepts.

What is claimed is:

1. A semiconductor device comprising:
a first gate pattern including a first gate spacer and a second gate pattern including a second gate spacer on a substrate, the first gate pattern including a first capping pattern and having a first height and the second gate pattern including a second capping pattern and having a second height;
an inter-metal dielectric pattern on the substrate covering the first and second gate patterns, the inter-metal dielectric pattern including a trench exposing the substrate between the first and second gate patterns;
a spacer contacting at least a portion of a sidewall of the inter-metal dielectric pattern defining the trench, the spacer spaced apart from the first and second gate patterns and having a third height larger than the first and second heights; and
a contact structure in the trench, the contact structure including a metal pattern and a distinct barrier layer,
wherein the spacer is not formed on a first uppermost surface of the first gate pattern and a second uppermost surface of the second gate pattern,
wherein sidewalls of the trench include a recessed portion.

2. The semiconductor device of claim 1, further comprising a source or a drain between the first gate pattern and the second gate pattern, wherein a top surface of the source or drain is higher than a bottom surface of the first gate pattern or a bottom surface of the second gate pattern, respectively.

3. The semiconductor device of claim 1, wherein a lower surface of the spacer contacts the substrate.

4. The semiconductor device of claim 1, wherein a portion of the inter-metal dielectric pattern is between each of the first and second gate patterns and the spacer.

5. The semiconductor device of claim 4, wherein the spacer and the inter-metal dielectric pattern are made of different materials.

6. The semiconductor device of claim 1, wherein the contact structure is spaced apart from the first and second gate patterns.

7. The semiconductor device of claim 6, wherein the contact structure contacts the spacer.

8. A semiconductor device comprising:
a first gate pattern and a second gate pattern on a substrate, the first gate pattern including a first capping pattern and having a first height and the second gate pattern including a second capping pattern and having a second height;
an inter-metal dielectric pattern on the substrate, the inter-metal dielectric pattern covering the first and second gate patterns;
an upper contact pattern between the first and second gate patterns, the upper contact pattern having a first width;
a lower contact pattern on a lower portion of the upper contact pattern between the first and second gate patterns, the lower contact pattern having a second width narrower than the first width and including a metal pattern and a distinct barrier layer; and
a spacer contacting a sidewall of the lower contact pattern, the spacer spaced apart from the first and second gate patterns and having a third height larger than the first and second heights,
wherein the spacer is not formed on a first uppermost surface of the first gate pattern and a second uppermost surface of the second gate pattern,
wherein a width of the upper contact pattern and a width of the lower contact pattern are different from each other at an interface between the upper contact pattern and the lower contact pattern.

9. The semiconductor device of claim 8, wherein the upper contact pattern and the lower contact pattern have a hammer shape.

10. The semiconductor device of claim 8, wherein the upper contact pattern is spaced apart from the first and second gate patterns.

11. The semiconductor device of claim 8, wherein a lower surface of the spacer contacts the substrate.

12. The semiconductor device of claim 8, wherein a portion of the inter-metal dielectric pattern is between each of the first and second gate patterns and the spacer.

13. The semiconductor device of claim 12, wherein the spacer and the inter-metal dielectric pattern are made of different materials.

14. A semiconductor device comprising:
a first spacer contacting a sidewall of a gate electrode, the first spacer having a first height;
an inter-metal dielectric pattern on the substrate covering the gate electrode and contacting a sidewall of the first spacer;
a second spacer contacting a sidewall of the inter-metal dielectric pattern, the second spacer different from the first spacer and having a second height greater than the first height, the first spacer, the inter-metal dielectric pattern, and the second spacer being sequentially arranged; and
a conductive layer pattern contacting a sidewall of the second spacer,
wherein the second spacer is not formed on an uppermost surface of the gate electrode,
wherein sidewalls of the conductive layer pattern include a protruding portion that does not contact the sidewall of the second spacer,
wherein a width of the protruding portion is wider than a width of an other portion of the conductive layer pattern.

15. The semiconductor device of claim 14, wherein the first spacer includes silicon nitride, silicon oxynitride, silicon oxide, and/or silicon carbon oxynitride.

16. The semiconductor device of claim 14, wherein the second spacer and the inter-metal dielectric pattern are made of different materials.

17. The semiconductor device of claim 14, wherein the conductive layer pattern has a hammer shape.

18. The semiconductor device of claim 14, wherein the conductive layer pattern is spaced apart from the first spacer.

* * * * *